United States Patent
Kobayashi et al.

(10) Patent No.: US 8,711,604 B2
(45) Date of Patent: Apr. 29, 2014

(54) NON-VOLATILE SEMICONDUCTOR MEMORY AND DATA PROCESSING METHOD IN NON-VOLATILE SEMICONDUCTOR MEMORY

(75) Inventors: Shigeki Kobayashi, Kuwana (JP); Hideyuki Tabata, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 13/544,412

(22) Filed: Jul. 9, 2012

(65) Prior Publication Data
US 2013/0182488 A1 Jul. 18, 2013

(30) Foreign Application Priority Data
Jul. 14, 2011 (JP) .................................. 2011-155447

(51) Int. Cl.
*G11C 11/00* (2006.01)
*G06F 11/10* (2006.01)
*G11C 29/04* (2006.01)

(52) U.S. Cl.
CPC ........ *G06F 11/1012* (2013.01); *G06F 11/1008* (2013.01); *G11C 2029/0411* (2013.01); *G06F 11/10* (2013.01)
USPC .. 365/148; 365/200; 365/189.15; 365/189.16

(58) Field of Classification Search
CPC . G06F 11/1012; G06F 11/1008; G06F 11/10; G11C 2029/041
USPC .......................... 365/148, 200, 189.15, 189.16
See application file for complete search history.

(56) References Cited

U.S. PATENT DOCUMENTS

| | | | |
|---|---|---|---|
| 5,140,597 A | 8/1992 | Araki | |
| 6,700,827 B2 * | 3/2004 | Lien et al. | ..................... 365/222 |
| 7,225,390 B2 | 5/2007 | Ito et al. | |
| 7,376,012 B2 * | 5/2008 | Kawamoto et al. | ...... 365/185.09 |
| 7,876,626 B2 | 1/2011 | Mukai et al. | |
| 8,136,015 B2 * | 3/2012 | Kawai et al. | .................. 714/763 |
| 8,194,463 B2 * | 6/2012 | Kim et al. | ................ 365/185.22 |
| 2010/0115383 A1 | 5/2010 | Toda | |
| 2011/0205654 A1 * | 8/2011 | Sakurai | ........................... 360/31 |
| 2011/0276858 A1 * | 11/2011 | Tarui et al. | ..................... 714/763 |

FOREIGN PATENT DOCUMENTS

| | | |
|---|---|---|
| JP | 2-203500 | 8/1990 |
| JP | 2004-46969 | 2/2004 |
| JP | 2009-230796 | 10/2009 |
| JP | 2009-295252 | 12/2009 |
| JP | 2010-108569 | 5/2010 |

* cited by examiner

*Primary Examiner* — Viet Q Nguyen

(74) *Attorney, Agent, or Firm* — Oblon, Spivak, McClelland, Maier & Neustadt, L.L.P.

(57) ABSTRACT

A non-volatile semiconductor memory according to an embodiment includes: a data storage unit including a memory cell array and a writing circuit; an encoder that directs the writing circuit to write write data to the memory cell array; a writing determining circuit that determines whether the writing of the write data to the memory cell array within a predetermined number of writing operations fails or succeeds, inverts the write data to generate new write data when the writing of the write data fails, and directs the writing circuit to write the new write data to the memory cell array; a switching circuit that inverts read data which is read from the memory cell to generate new read data when the writing determining circuit determines that the writing of the write data fails; and a decoder that decodes the read data into the information data.

12 Claims, 5 Drawing Sheets

NON-VOLATILE SEMICONDUCTOR MEMORY AND DATA PROCESSING METHOD IN NON-VOLATILE SEMICONDUCTOR MEMORY

CROSS-REFERENCE TO RELATED APPLICATIONS

This application is based upon and claims the benefit of priority from the prior Japanese Patent Application No. 2011-155447, filed on Jul. 14, 2011, the entire contents of which are incorporated herein by reference.

FIELD

Embodiments relate to a non-volatile semiconductor memory and a data processing method in a non-volatile semiconductor memory.

BACKGROUND

In recent years, a resistive RAM (ReRAM) has attracted much attention for the application to the next generation non-volatile semiconductor memory. In ReRAM, the resistance values of the variable resistance film are controlled by applying voltage pulse so that the two different resistance states are realized. Since these two different resistance states are kept even after removing the electrical bias, ReRAM can be act as a non-volatile memory.

Among the various candidates of the variable resistance films for ReRAM, it seems that some materials have the favorable resistance values; some are difficult to change the low resistance states to the high resistance states, and some are difficult to change the high resistance state to the low resistance states. Since changing the resistance states correspond to the data program or the data erase in the ReRAM, the difficulty in changing the resistance states causes to the error in the data program or the data erase operations. Thus, in order to improve the reliability of ReRAM, error in the data program and/or data erase should be suppressed, and if occurred, the error should be compensated.

For example, the following method is also considered: when the writing or erasing of data does not succeed within a predetermined number of times, the writing or erasing of data to or from the memory cell is abandoned and data is corrected using the error correcting code (ECC) which has been used during a data reading (decoding) operation. However, an ECC with an error correction capability more than that in the related art is needed in order to correct a data inversion error which occurs when the written or erased data is stored and an error which occurs when data is written or erased. In general, in order to improve the error correction capability of the ECC, a large amount of parity data is stored separately from data which is desired to be stored such that errors can be corrected. However, when the amount of parity data increases, effective storage capacity for storing data which is desired to be stored is reduced, which is not preferable.

Therefore, in the ReRAM in which the resistance variable film which is less likely to be changed from the low resistance state to the high resistance state or from the high resistance state to the low resistance state is used in the memory cell, the problem is to prevent an increase in the amount of parity data while achieving error correction capability higher than that in the related art to correct errors which occur when data is written or erased.

DETAILED DESCRIPTION

A non-volatile semiconductor memory according to an embodiment includes: a data storage unit including a memory cell array that includes a plurality of memory cells and a writing circuit that performs an operation of writing write data to the memory cell array; an encoder that generates the write data from information data and directs the writing circuit to write the write data to the memory cell array; a writing determining circuit that determines whether the writing of the write data to the memory cell array within a predetermined number of writing operations fails or succeeds, inverts the write data to generate new write data when the writing of the write data fails, and directs the writing circuit to write the new write data to the memory cell array; a switching circuit that inverts read data which is read from the memory cell to generate new read data when the writing determining circuit determines that the writing of the write data fails; and a decoder that receives the read data which is read from memory cell array through the switching circuit and decodes the read data into the information data.

Hereinafter, a non-volatile semiconductor memory according to an embodiment will be described with reference to the accompanying drawings.

The semiconductor memory device according to the embodiment has a code error correction function using an error correcting code (ECC).

First, an example of a memory cell array of the semiconductor memory device according to the embodiment will be described.

Figure 1A:
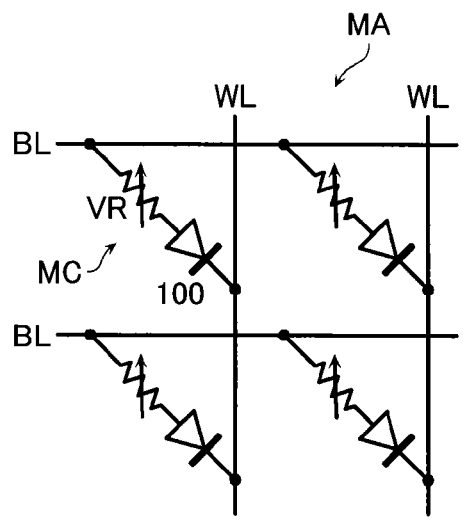
FIG. 1A is an equivalent circuit diagram illustrating a memory cell array according to an embodiment.
Figure 1B:
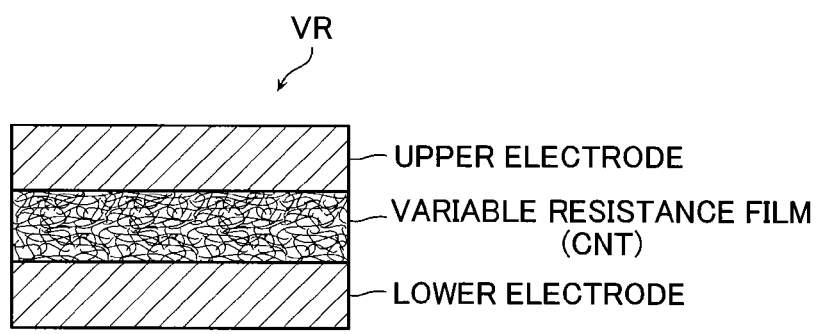
FIG. 1B is a diagram illustrating the structure of a memory cell according to the embodiment.

FIG. 1A is an equivalent circuit diagram illustrating a portion of a memory cell array MA according to the embodiment and FIG. 1B is a diagram illustrating the structure of a portion of the memory cell MC illustrated in FIG. 1A.

As illustrated in FIG. 1A, the memory cell array MA includes a plurality of word lines WL, a plurality of bit lines BL which intersect the plurality of word lines WL, and a plurality of memory cells MC which are provided at intersections of the plurality of word lines WL and the plurality of bit lines BL.

The memory cell MC includes a variable resistive element VR and a current rectifying element 100 which are connected in series to each other. The memory cell MC stores data using a difference in the resistance value of the variable resistive element VR. That is, for example, data "0"/"1" is defined according to the resistance value of the variable resistive element VR. In addition, a predetermined voltage may be applied to the variable resistive element VR for a predetermined period of time to change the resistance value of the variable resistive element VR.

Hereinafter, a state in which the resistance value of the variable resistive element VR is small is referred to as a "set state" and a state in which the resistance value of the variable resistive element VR is large is referred to as a "reset state". In addition, an operation of changing the state of the variable resistive element VR from a high resistance state to a low resistance state is referred to as a "set operation" and an operation of changing the state of the variable resistive element VR from the low resistance state to the high resistance state is referred to as a "reset operation". In some cases, the set operation and the reset operation are referred to as a "writing operation".

As illustrated in FIG. 1B, the variable resistive element VR includes a lower electrode, an upper electrode, and a resistance variable film which is interposed between the upper electrode and the lower electrode. For example, the resistance variable film is made of a bimetallic oxide including nickel oxide (NiO) or a multi-metallic oxide including a strontium zirconium oxide (SrZrO$_3$) which has been widely studied and developed. However, it is difficult to control and manufacture the composition or crystalline structure of the metal oxide, and the instability or variation of the electric characteristics of a resistance variable film which is considered to occur due to low controllability of the composition or crystalline structure is large. In addition, the metal oxide makes it difficult to obtain high reproducibility and desired electric characteristics.

A carbon-based material is also considered as a candidate material forming the resistance variable layer and a method of manufacturing the carbon-based material has been studied. Since the carbon-based material includes sole carbon, it is relatively easy to control the composition thereof, the dependence of the carbon-based material on process conditions is low, and it is easy to control the carbon-based material.

However, when the carbon film is not manufactured at a high temperature and high pressure, black lead, a so-called graphite structure is easily formed, which results in low electrical resistivity. When the electrical resistivity is too low, a large amount of current flows to the memory cell when the electric resistance state is changed, resulting in an increase in power consumption. It is considered that the resistance state is changed due to a difference in the bonding state of carbon in the film (sp3 bonding and sp2 bonding). It is expected that a large amount of current will be needed in order to change the bonding state. Therefore, it may be difficult to reduce the amount of current required to change resistance.

In the carbon-based film, a carbon-based nanomaterial is also one of the candidates of the material forming the resistance variable memory element. The carbon-based nanomaterial is the general term of a carbon nanotube, fullerene, and other carbon materials having a steric structure. Unlike a bulk film which is formed as a homogeneous film, since a carbon-based nanomaterial layer has a steric structure in which there is a large space between the microtubes which are stacked, a current path is spatially limited. Therefore, even when the carbon-based nanomaterial is a conductor, a small amount of current flows through the carbon-based nanomaterial layer and it is possible to reduce the amount of current required to change the electrical resistance state of the carbon-based nanomaterial layer.

The detailed resistance change mechanism of the carbon-based nanomaterial layer is unclear. However, the resistance variable memory using the carbon-based nanomaterial has drawn attention since it can reduce the amount of current required to change the electrical resistance state using the current limiting mechanism of the carbon-based nanomaterial.

For the above-mentioned reason, it is preferable that the resistance variable film be made of the carbon-based nanomaterial.

It is preferable that the lower electrode and the upper electrode be made of a material which is resistant to heat and has a small resistance value. For example, the lower electrode and the upper electrode may be made of tungsten (W), titanium (Ti), tungsten nitride (WN), titanium nitride (TiN), tungsten silicide (WSi), nickel silicide (NiSi), or cobalt silicide (CoSi).

For example, the current rectifying element 100 may be made of any material and may have any structure as long as it has predetermined current rectification characteristics in voltage and current characteristics. A diode made of polysilicon (Poly-Si) is given as an example of the current rectifying element 100. As an example of the diode, a PN junction diode including a p-type layer and an n-type layer including impurities is used. In addition to the PN junction diode, examples of the diode may include various diodes, such as a Schottky diode and a PIN diode in which an i layer without including any impurity is inserted between a p-type layer and an n-type layer, and a punch through diode. In addition, the current rectifying element 100 may be made of a semiconductor, such as silicon germanium (SiGe) or germanium (Ge), a mixed crystal of a semiconductor and metal, or an insulator, such as oxide, in addition to silicon (Si) so as to obtain current rectification characteristics in which desired current and voltage can be supplied to the variable resistive element VR of the selected memory cell MC.

When the resistance variable film of the variable resistive element VR is made of the carbon-based nanomaterial, the research result of the inventors proves that the variable resistive element VR is likely to be reset, but is less likely to be set. Therefore, it is necessary to repeatedly perform the writing operation in order to set the variable resistive element VR. However, when the writing operation is repeatedly performed, the time required to write data increases.

In order to avoid an increase in the data writing time due to the variable resistive element VR which is less likely to be set, the following method is used: when the variable resistive element VR is not set even though the writing operation is repeatedly performed a predetermined number of times, the writing operation is stopped. In this way, it is possible to prevent an increase in the time required to write data. In the range of code error correction capability by the mounted ECC, when data is read (decoded), it is possible to recover correct data which will be originally written. Therefore, the reliability of a memory operation is ensured.

However, as described above, in the method in which, when the variable resistive element VR is not set even though the writing operation is repeatedly performed a predetermined number of times, the writing operation is stopped and correct data is recovered by ECC during the reading (decoding) of data, the following data is needed: parity data for guaranteeing data storage characteristics which store necessary write data in a non-volatile manner; and parity data for guaranteeing a writing error occurring in the writing operation for the variable resistive element VR which is less likely to be set. In this case, the ratio of the parity data to the original information data which is desired to be stored increases and the effective storage capacity of the semiconductor memory device is reduced.

However, in the code error correction method using the ECC according to the related art, information data is recovered by code error correction using the ECC, without clarifying the position where an error occurs due to data inversion for the period from the time when the encoder encodes data to the time when the information data is recovered by the reading (decoding) of data. That is, the code error correction method using the ECC according to the related art does not consider the position where a data inversion error occurs.

In the following description, high-efficiency code error correction is achieved by a method considering the position where the data inversion error occurs. The code error correction method is effective in a semiconductor memory device in which an error is likely to occur during a writing operation, such as a semiconductor memory device using the variable resistive element VR made of a carbon-based nanomaterial, unless otherwise noted.

Unless otherwise noted, a case in which a hamming code (the hamming code is an example of the error correcting code) capable of correcting a 1-bit error is used in the semiconductor memory device using the variable resistive element VR made of a carbon-based nanomaterial will be described below as an example.

In addition, data to be written to the memory cell array MA is referred to as "write data", data stored in the memory cell array MA is referred to as "stored data", and data read from the memory cell MA is referred to as "read data". Therefore, when no error occurs for the period from the time when a writing operation is performed on the memory cell array MA to the time when a read operation is performed on the memory cell array MA, the write data, the stored data, and the read data are the same.

Figure 2:
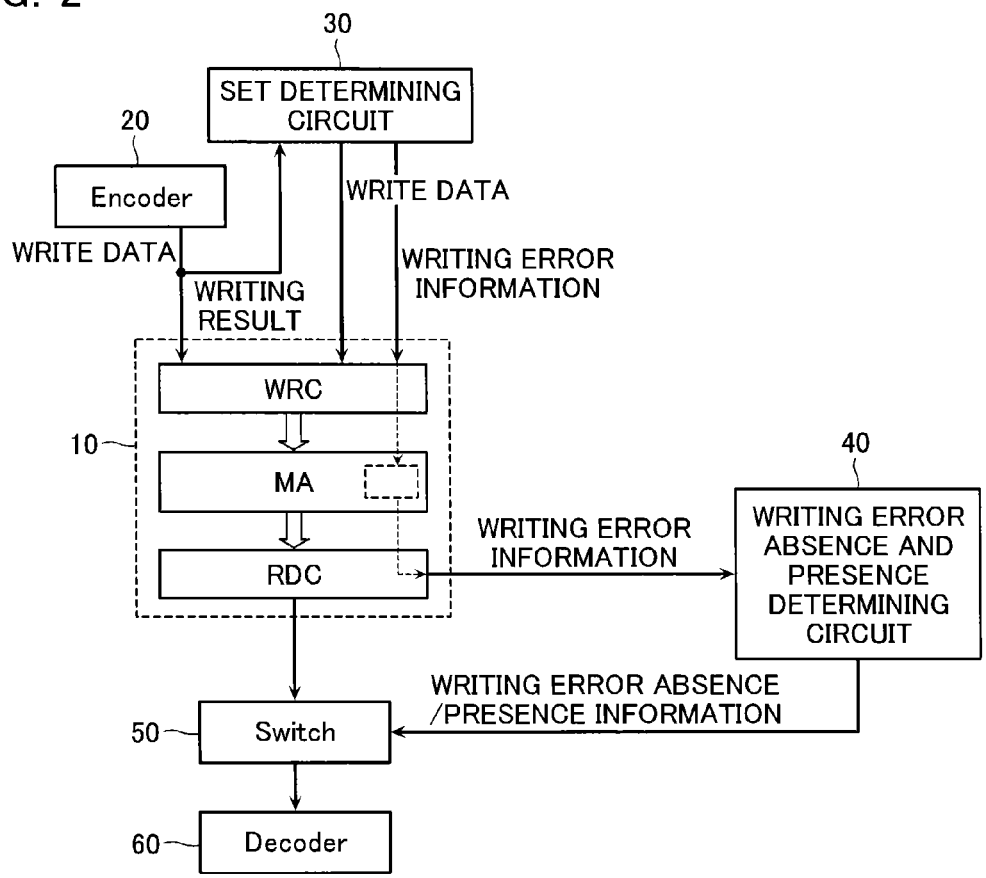
FIG. 2 is a block diagram illustrating a semiconductor memory device according to the embodiment.

FIG. 2 is a block diagram illustrating the semiconductor memory device according to the embodiment.

The semiconductor memory device includes a data storage unit 10 that stores data, an encoder 20 that generates write data from information data which is input from the outside, and a set determining circuit 30, which is a writing determining circuit that determines whether the write data is written to the data storage unit 10.

The data storage unit 10 includes a writing circuit WRC that writes the write data input from the outside of the data storage unit 10 to the memory cell array MA and a reading circuit RDC that reads the stored data which is stored in the memory cell array MA and outputs it as read data to the outside of the data storage unit 10, in addition to the memory cell array MA illustrated in FIG. 1A.

The encoder 20 encodes the information data input from the outside into a hamming code which can be corrected by 1-bit error correction.

Figure 3:
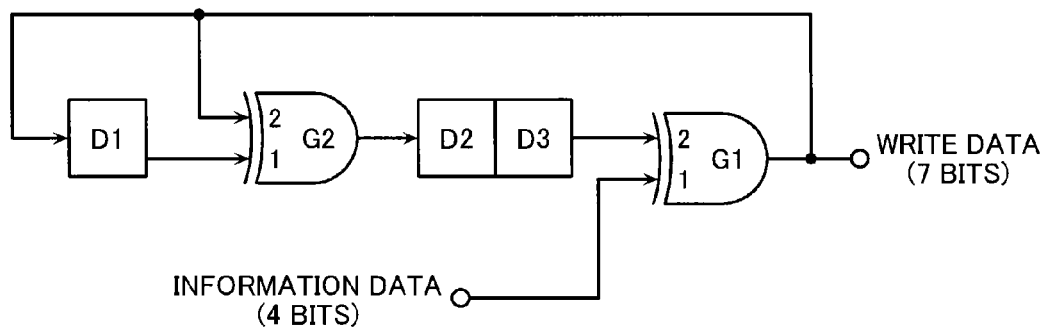
FIG. 3 is a block diagram illustrating an encoder of the semiconductor memory device according to the embodiment.

FIG. 3 is a block diagram illustrating the encoder 20 which generates write data including 3-bit parity data from 4-bit information data.

The encoder 20 includes an XOR gate G1 including a first input to which information data is input for, for example, each clock, a delay flip-flop D1 that holds the output of the XOR gate G1 which is fed back, an XOR gate G2 including a first input to which the output of the delay flip-flop D1 is input and a second input to which the output of the XOR gate G1 is input, a delay flip-flop D2 that holds the output of the XOR gate G2, and a delay flip-flop D3 that holds the output of the delay flip-flop D2. The output of the delay flip-flop D3 is input to the second input of the XOR gate G2. The output of the XOR gate G1 becomes the output of the encoder 20. The delay flip-flop has a function of outputting the held data for each clock and holding newly input data.

The encoder 20 having the above-mentioned structure is a hamming code encoding circuit having a generation polynomial $G(x)=x^3+x+1$.

The 4-bit information data input to the encoder 20 is output as the first to fourth bits of the write data and is input to a shift register including the XOR gates G1 and G2 and the delay flip-flops D1 to D4. The shift register divides the information data using the generation polynomial G(x) and the remainder of the division is held as parity data in the delay flip-flops D1 to D3. The parity data held in the delay flip-flops D1 to D3 is sequentially output as the fifth to seventh bits of the write data.

In this example, the 4-bit information data is used. However, the length of one write data item is set in advance such that a maximum of one bit of the bit inversion error occurs in one write data item during a writing operation and the period for which data is held.

The write data output from the encoder 20 is input to the writing circuit WRC of the data storage unit 10 and is then written to the memory cell array MA by the writing circuit WRC.

The set determining circuit 30 checks whether the variable resistive element VR to be set is normally set on the basis of the write data (hereinafter, referred to as "success in the set operation"). When the variable resistive element VR is not set (hereinafter, referred to as "failure in the set operation") even though the writing operation is performed a predetermined number of times, the write data "0"/"1" generated by the encoder 20 is inverted and is then transmitted as new write data to the writing circuit WRC. Then, writing error information indicating whether the variable resistive element VR is normally set is stored in the data storage unit 10 (for example, a specific region of the memory cell array MA represented by a dotted line in FIG. 2).

The writing error information is stored in, for example, a predetermined address region of the memory cell array MA separately from the write data. Since the writing error information indicates only whether the memory cell MC is normally set, 1-bit data "0"/"1" is sufficient to represent the writing error information.

In order to ensure the reliability of the writing error information, it is preferable to store, for example, a hamming code obtained by adding parity data to the writing error information. In this case, the writing error information is 3-bit data "111" (in the case of "1") or "000" (in the case of "0").

In FIG. 2, the set determining circuit 30 is used as the writing determining circuit. However, in the semiconductor memory device using the memory cell MC which is less likely to be reset, a reset determining circuit which checks whether the memory cell MC is normally reset may be used instead of the set determining circuit 30.

In addition, the semiconductor memory device according to this embodiment includes a writing error absence and presence determining circuit 40 that determines whether there is a writing error, a switching unit 50 that inverts read data when there is a writing error, and a decoder 60 that decodes the read data into information data.

The writing error absence and presence determining circuit 40 acquires the writing error information stored in the data storage unit 10, determines whether there is a writing error, and transmits writing error absence/presence information indicating the determination result to the switching unit 50.

Figure 4:
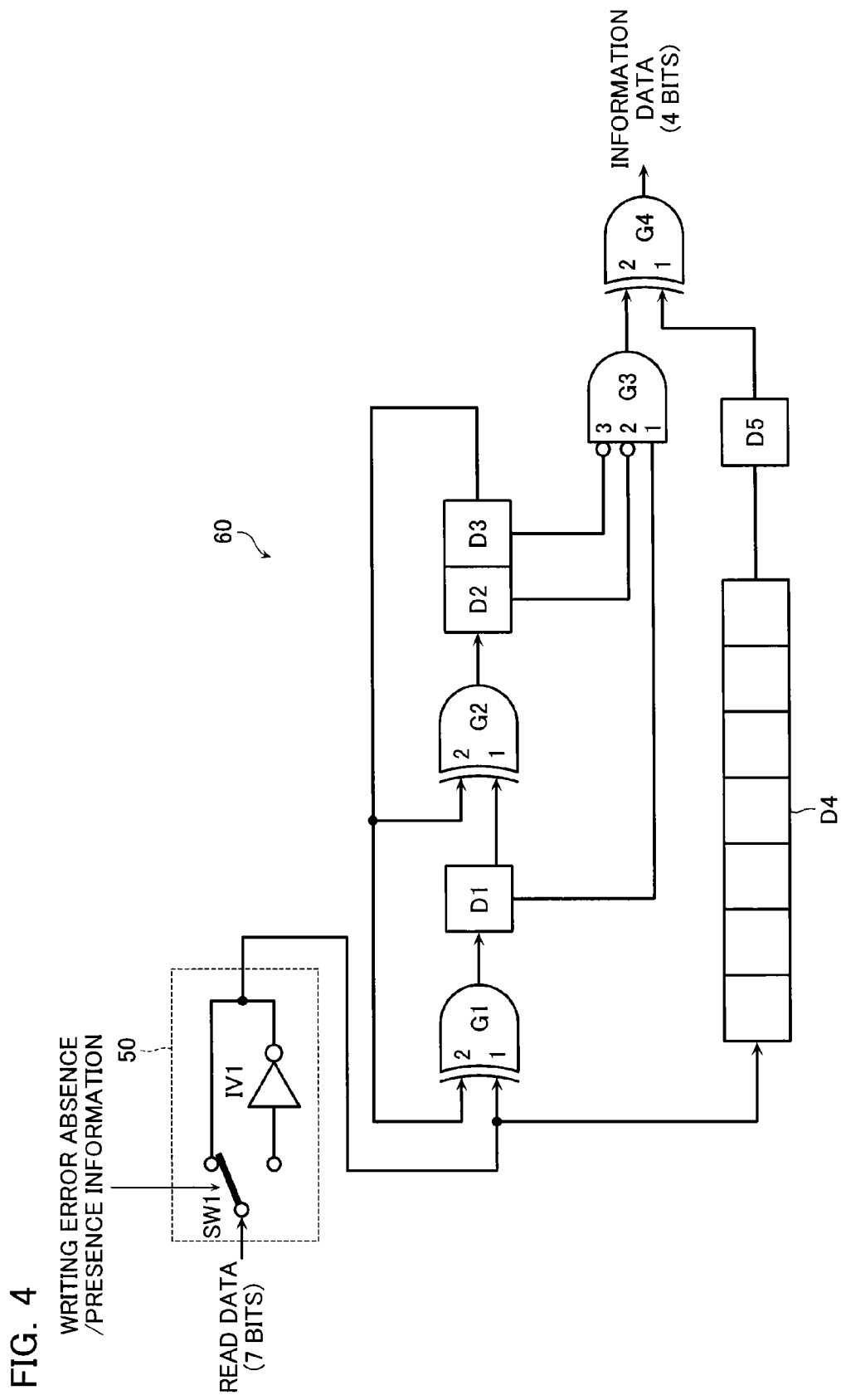
FIG. 4 is a block diagram illustrating a decoder of the semiconductor memory device according to the embodiment.

As illustrated in FIG. 4, the switching unit 50 includes a switch SW1 which is controlled by the writing error absence/presence information input from the writing error absence and presence determining circuit 40 and an inverter IV1 that inverts the read data. When there is a writing error, each bit of the read data output from the reading circuit RDC is inverted by the inverter IV1 and is then transmitted to the decoder 60.

On the other hand, when there is no writing error, the read data output from the reading circuit RDC is transmitted to the decoder 60 as it is.

The decoder 60 performs code error correction on the read data output from the switching unit 50 and decodes the read data into correct information data. FIG. 4 is a block diagram illustrating an example of the decoder 60.

The decoder 60 includes an XOR gate G1 including a first input to which the read data output from the switching unit 50 is input, a delay flip-flop D1 that holds the output of the XOR gate G1, an XOR gate G2 including a first input to which the output of the delay flip-flop D1 is input, a delay flip-flop D2 that holds the output of the XOR gate G2, and a delay flip-flop D3 that holds the output of the delay flip-flop D2. The output of the delay flip-flop D3 is fed back to a second input of the XOR gate G1 and a second input of the XOR gate G2.

In addition, the decoder 60 includes a 7-unit time delay circuit D4 to which the read data output from the switching unit 50 is input, a delay flip-flop D5 that holds the output of the 7-unit time delay circuit D4, a 3-input AND gate G3 including a first positive logic input, a second negative logic input, and a third negative logic input to which the outputs of the delay flip-flops D1, D2, and D3 are input, respectively, and an XOR gate G4 including a first input to which the output of the delay flip-flop D5 is input and a second input to which the output of the AND gate G3 is input. The 7-unit time delay circuit D4 includes seven delay flip-flops which are connected in series to each other. The output of the XOR gate G4 is the output of the decoder 60. The delay flip-flop has a function of outputting the held data and holding newly input data for each clock.

The decoder 60 having the above-mentioned structure is a hamming code decoding circuit using a generation polynomial $G(x)=x^3+x+1$.

Figure 5:
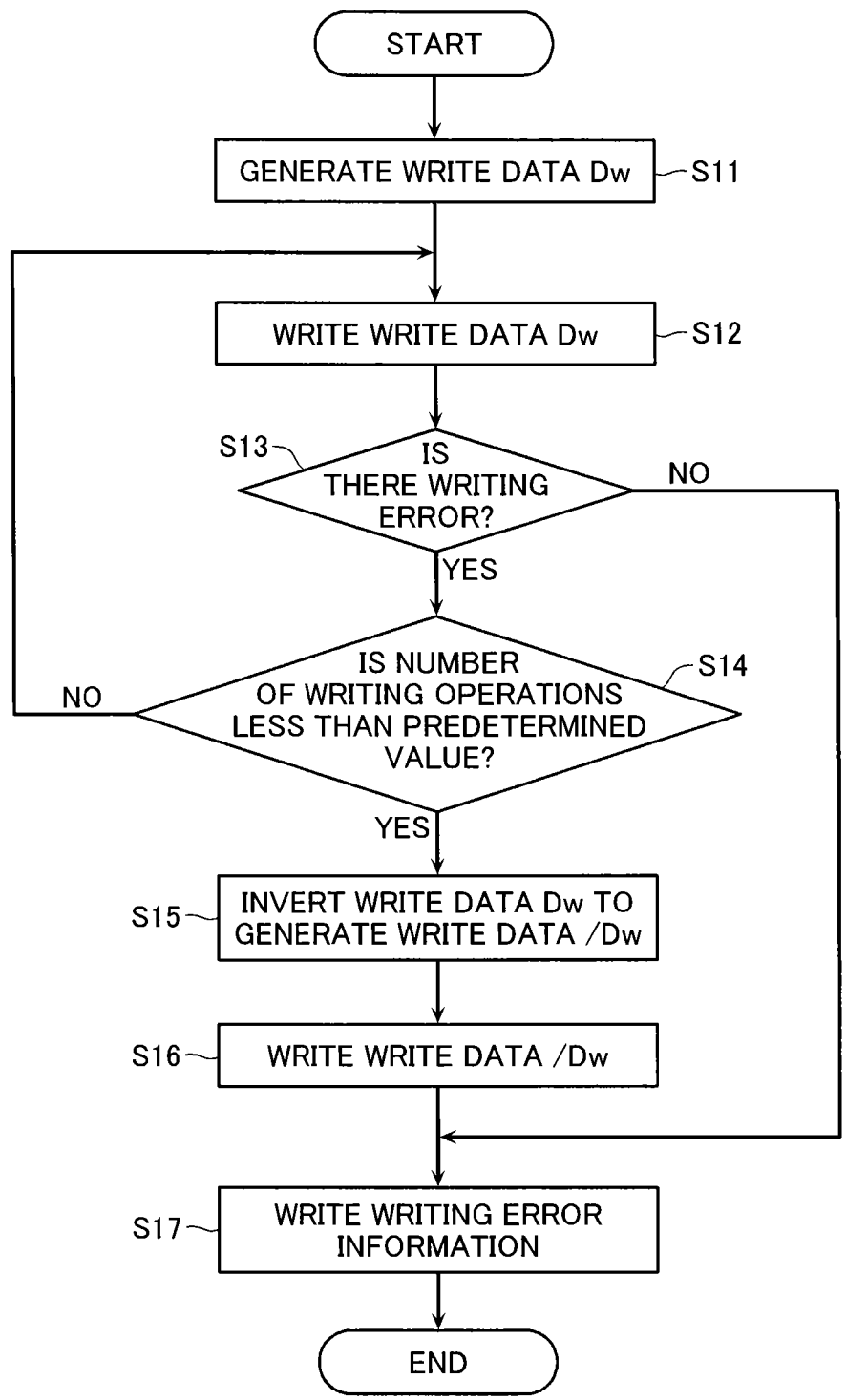
FIG. 5 is a flowchart illustrating a data writing process of the semiconductor memory device according to the invention.

Next, the writing of data by the above-mentioned structure will be described with reference to the flowchart illustrated in FIG. 5.

First, in Step S11, the encoder 20 generates write data Dw including parity data from information data Di which is input from the outside. The write data Dw is transmitted from the encoder 20 to the writing circuit WRC of the data storage unit 10.

Then, in Step S12, the writing circuit WRC performs an operation of writing the write data Dw to the memory cell array MA.

Then, in Step S13, the set determining circuit 30 determines whether the memory cell MC is normally set by the writing operation of the writing circuit WRC. As a result, when the memory cell MC is normally set, the process proceeds to the following Step S17. On the other hand, when the memory cell MC is not normally set, the writing operation of Step S12 is repeatedly performed a predetermined number of times, which are the upper limit (Step S14). When the number of times the writing operation is repeated is less than a predetermined value and the write data Dw is completely written, the process proceeds to Step S17.

On the other hand, when the number of times the writing operation is repeated reaches the predetermined value, but the writing operation is not completed in Step S14, the set determining circuit 30 inverts the write data Dw to generate new write data /Dw and transmits the new write data /Dw to the writing circuit WRC in Step S15. As such, when the write data Dw is inverted, it is not necessary to set the variable resistive element VR which is less likely to be set.

Then, in Step S16, the writing circuit WRC performs an operation of writing the write data /Dw to the memory cell array MA. The writing operation may be repeatedly performed until the write data /Dw is normally written.

Finally, in Step S17, the set determining circuit 30 generates information indicating whether the write data Dw is written or the inverted new write data /Dw is written on the basis of the result of the operation of writing the write data Dw and stores the information in the data storage unit 10.

In this way, the writing of data to the memory cell array MA is completed.

Figure 6:
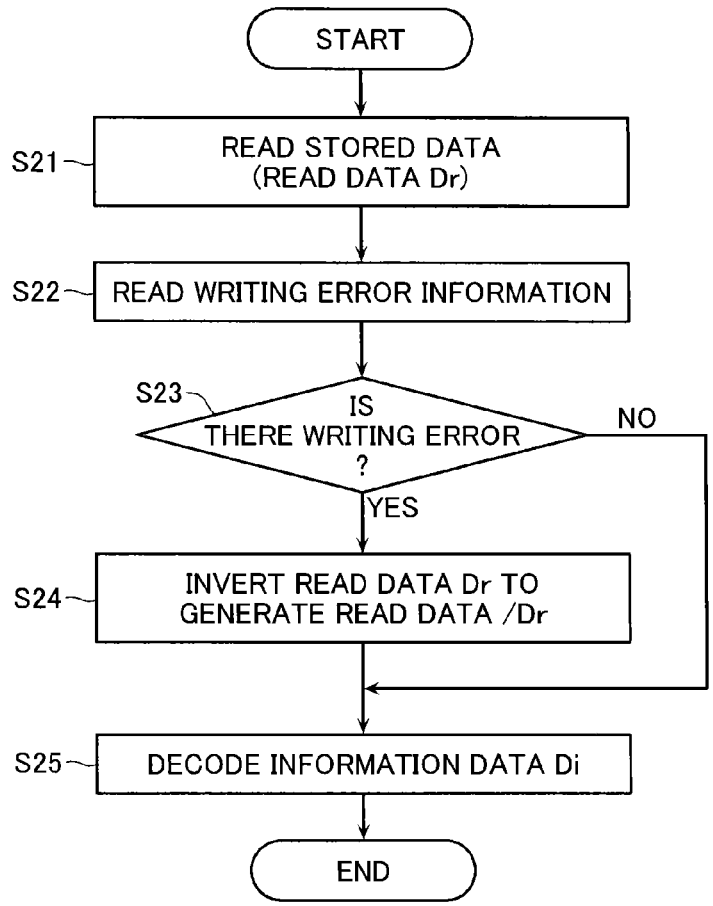
FIG. 6 is a flowchart illustrating a data reading process of the semiconductor memory device according to the invention.

Next, the reading of data will be described with reference to the flowchart illustrated in FIG. 6.

First, in Step S21, the reading circuit RDC of the data storage unit 10 reads the data stored in the memory cell array MA and transmits the data as read data Dr to the switching unit 50.

Then, in Step S22, the reading circuit RDC of the data storage unit 10 reads writing error information stored in, for example, a specific region of the memory cell array MA and transmits the writing error information to the writing error absence and presence determining circuit 40.

Then, in Step S23, the writing error absence and presence determining circuit 40 determines whether the write data Dw is written or the inverted new write data /Dw is written on the basis of the writing error information and transmits the determination result as writing error absence/presence information to the switching unit 50.

Then, the switching unit 50 processes the read data Dr on the basis of the writing error absence/presence information. When there is no writing error, the read data Dr input from the reading circuit RDC is transmitted to the decoder 60 as it is. On the other hand, when there is a writing error, the switching unit 50 inverts the read data Dr to generate read data /Dr and transmits the read data /Dr to the decoder 60 in Step S24.

Finally, in Step S25, the decoder 60 decodes the read data Dr or /Dr into the information data Di.

In this way, the reading of data from the memory cell array MA is completed.

Next, the efficiency of the code error correction of the semiconductor memory device according to this embodiment will be described while being compared with the efficiency of code error correction according to a comparison example.

Figure 7:
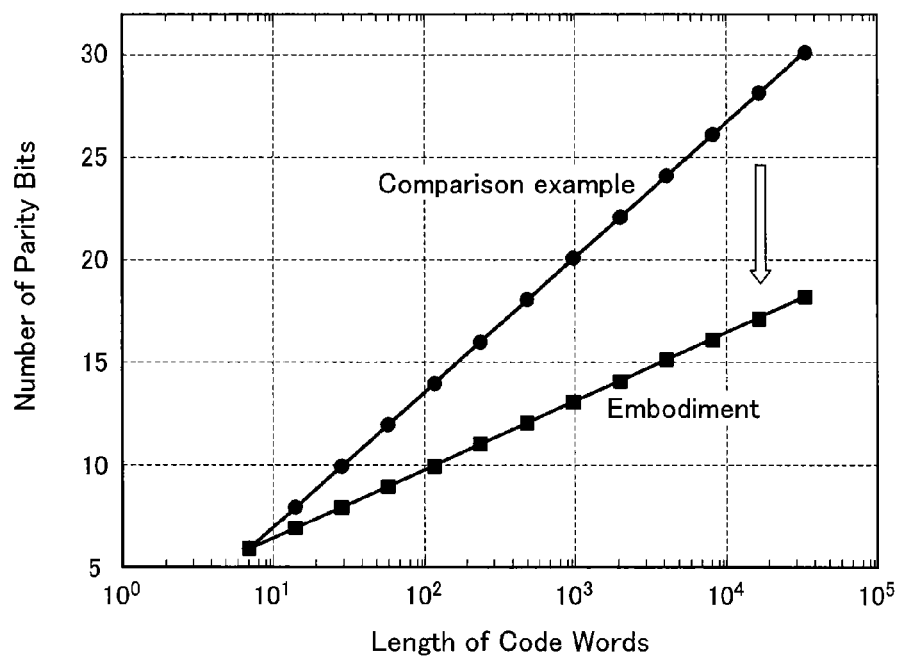
FIG. 7 is a graph illustrating the relation between the length of write data and the length of parity data in the semiconductor memory devices according to the embodiment and a comparison example.

FIG. 7 is a graph illustrating the relationship between the length of write data and the length of parity data in the embodiment ("Embodiment" in FIG. 7) and the comparison example ("Comparison example" in FIG. 7). When the length of write data is the same, it is preferable that the length of parity data be short in order to store a large amount of desired information data. The graph is plotted on condition that the frequency of occurrence of the code inversion error is the frequency of occurrence of a maximum of one bit of the bit inversion error during a writing operation and a data retention period when write data with a predetermined length is written and read.

In this embodiment, it is assumed that a hamming code capable of correcting a 1-bit code error is used when the write data is encoded. In the comparison example, it is assumed that a BCH code capable of correcting a 2-bit code error which is currently being used as an ECC is used.

As can be seen from FIG. 7, according to this embodiment, the length of parity data ("Number of Parity Bits" in FIG. 7) is shorter than that in the comparison example at any length of write data ("Length of Code Words" in FIG. 7).

For example, when the length of write data is 2047 bits, information data is 2025 bits and 22-bit parity data is needed in the comparison example.

In contrast, in this embodiment, information data is 2036 bits and only 11-bit parity data is needed. Even when 3-bit writing error information encoded with hamming codes is considered, the length of parity data is 14 bits.

As described above, according to this embodiment, since the writing error is treated separately from other errors, it is possible to reduce the amount of parity data, as compared to the code error correction according to the comparison example. Therefore, it is possible to provide a semiconductor memory device capable of correcting a code error with high efficiency.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory comprising:
    a data storage unit including a memory cell array that includes a plurality of memory cells and a writing circuit that performs an operation of writing write data to the memory cell array;
    an encoder that generates the write data from information data and directs the writing circuit to write the write data to the memory cell array;
    a writing determining circuit that determines whether the writing of the write data to the memory cell array within a predetermined number of writing operations fails or succeeds, inverts the write data to generate new write data when the writing of the write data fails, and directs the writing circuit to write the new write data to the memory cell array;
    a switching circuit that inverts read data which is read from the memory cell to generate new read data when the writing determining circuit determines that the writing of the write data fails; and
    a decoder that receives the read data which is read from the memory cell array through the switching circuit and decodes the read data into the information data.

2. The non-volatile semiconductor memory according to claim 1,
    wherein the length of one write data item is set in advance on the basis of a bit length at which an error in a predetermined number of bits occurs a predetermined number of times during the writing operation.

3. The non-volatile semiconductor memory according to claim 1,
    wherein the determination result of the writing determining circuit is stored in the data storage unit.

4. The non-volatile semiconductor memory according to claim 1,
    wherein parity information that is generated on the basis of the determination result of the writing determining circuit is added to the determination result of the writing determining circuit and the determination result of the writing determining circuit is stored.

5. The non-volatile semiconductor memory according to claim 1,
    wherein the memory cell includes one or more resistance variable films, and
    one of a change in the resistance state of the resistance variable film from a low resistance state to a high resistance state and a change in the resistance state of the resistance variable film from the high resistance state to the low resistance state occurs less than the other change.

6. The non-volatile semiconductor memory according to claim 5,
    wherein the resistance variable film is made of a carbon-based nanomaterial, such as a carbon nanotube, fullerene, or other carbon materials with a steric structure.

7. A data processing method in a non-volatile semiconductor memory that includes a memory cell array including a plurality of memory cells and a data storage unit, comprising:
    writing data to the non-volatile semiconductor memory; and
    reading data from the non-volatile semiconductor memory,
    the writing of the data to the non-volatile semiconductor memory including:
    generating write data to be written to the memory cell array from information data;
    performing an operation of writing the write data to the memory cell array within a predetermined number of writing operations;
    determining whether the writing of the write data to the memory cell array within the predetermined number of writing operations fails or succeeds; and
    inverting the write data to generate new write data and writing the new write data to the memory cell array when the writing of the write data fails, and
    the reading of the data from the non-volatile semiconductor memory including:
    reading read data from the memory cell array;
    inverting the read data to generate new read data when the writing of the write data to the memory cell array within the predetermined number of writing operations fails; and
    decoding the read data into the information data.

8. The data processing method in the non-volatile semiconductor memory according to claim 7,
    wherein, when the write data is generated from the information data, one write data item which has a data length based on a bit length at which an error with a predetermined number of bits occurs a predetermined number of times during the writing operation is generated.

9. The data processing method in the non-volatile semiconductor memory according to claim 7,
    wherein, after it is determined whether the writing of the write data to the memory cell array within the predetermined number of writing operations fails or succeeds, the determination result is stored in the data storage unit.

10. The data processing method in the non-volatile semiconductor memory according to claim 9,
    wherein, when the determination result is stored in the data storage unit, the determination result and parity information that is generated on the basis of the determination result are stored in the memory cell array.

11. The data processing method in the non-volatile semiconductor memory according to claim 7,
    wherein, when the write data is generated from the information data, a hamming code based on the information data is generated as the write data.

12. The data processing method in the non-volatile semiconductor memory according to claim 11,
    wherein, when the read data is decoded into the information data, the information data is decoded using the read data as the hamming code.

* * * * *